(12) United States Patent
Kim et al.

(10) Patent No.: US 11,069,833 B2
(45) Date of Patent: Jul. 20, 2021

(54) RESONANT CAVITY STRAINED III-V PHOTODETECTOR AND LED ON SILICON SUBSTRATE

(71) Applicant: INTERNATIONAL BUSINESS MACHINES CORPORATION, Armonk, NY (US)

(72) Inventors: Jeehwan Kim, Cambridge, MA (US); Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/732,736

(22) Filed: Jan. 2, 2020

(65) Prior Publication Data

US 2020/0144445 A1 May 7, 2020

Related U.S. Application Data

(60) Continuation of application No. 15/948,425, filed on Apr. 9, 2018, now Pat. No. 10,559,714, which is a
(Continued)

(51) Int. Cl.
*H01L 33/10* (2010.01)
*H01L 31/0232* (2014.01)
(Continued)

(52) U.S. Cl.
CPC ...... *H01L 33/105* (2013.01); *H01L 31/02327* (2013.01); *H01L 31/03046* (2013.01);
(Continued)

(58) Field of Classification Search
CPC ............ H01L 33/105; H01L 31/02327; H01L 31/03046; H01L 31/035272; H01L 31/105;
(Continued)

(56) References Cited

U.S. PATENT DOCUMENTS

| 5,547,898 | A | * | 8/1996 | Grodzinski | ........... H01S 5/3054 |
| | | | | | 117/89 |
| 6,177,686 | B1 | | 1/2001 | Gutierrez-Aitken | |

(Continued)

FOREIGN PATENT DOCUMENTS

| CN | 203607423 U | 5/2014 |
| CN | 104538466 A | 4/2015 |

(Continued)

OTHER PUBLICATIONS

U.S. Office Action issued in U.S. Appl. No. 15/948,577, dated Feb. 26, 2019, pp. 1-34.
(Continued)

*Primary Examiner* — Bo B Jang
(74) *Attorney, Agent, or Firm* — Tutunjian & Bitetto, P.C.; Erik Johnson

(57) ABSTRACT

An optoelectronic device that includes a germanium containing buffer layer atop a silicon containing substrate, and a first distributed Bragg reflector stack of III-V semiconductor material layers on the buffer layer. The optoelectronic device further includes an active layer of III-V semiconductor material present on the first distributed Bragg reflector stack, wherein a difference in lattice dimension between the active layer and the first distributed brag reflector stack induces a strain in the active layer. A second distributed Bragg reflector stack of III-V semiconductor material layers having a may be present on the active layer.

19 Claims, 3 Drawing Sheets

Related U.S. Application Data division of application No. 14/815,513, filed on Jul. 31, 2015, now Pat. No. 9,991,417.

(51) Int. Cl.

| | |
|---|---|
| *H01L 31/0304* | (2006.01) |
| *H01L 31/0352* | (2006.01) |
| *H01L 31/105* | (2006.01) |
| *H01L 31/18* | (2006.01) |
| *H01L 33/12* | (2010.01) |
| *H01L 33/00* | (2010.01) |
| *H01L 33/30* | (2010.01) |

(52) U.S. Cl.
CPC .... *H01L 31/035272* (2013.01); *H01L 31/105* (2013.01); *H01L 31/1844* (2013.01); *H01L 31/1852* (2013.01); *H01L 33/12* (2013.01); *H01L 33/0066* (2013.01); *H01L 33/30* (2013.01)

(58) Field of Classification Search
CPC . H01L 31/1844; H01L 31/1852; H01L 33/12; H01L 33/0066; H01L 33/30; H01L 33/60; H01L 33/20; H01L 33/62; H01L 33/54; H01L 33/44
See application file for complete search history.

(56) References Cited

U.S. PATENT DOCUMENTS

| | | | |
|---|---|---|---|
| 7,202,102 B2 | 4/2007 | Yao | |
| 8,274,127 B2 | 9/2012 | Nagai et al. | |
| 8,637,875 B2 | 1/2014 | Finkelstein et al. | |
| 9,040,916 B2 | 5/2015 | Cazaux et al. | |
| 2002/0063303 A1 | 5/2002 | Pauchard et al. | |
| 2003/0035964 A1 | 2/2003 | Richard et al. | |
| 2007/0054467 A1* | 3/2007 | Currie | H01L 27/1203 438/458 |
| 2010/0181601 A1* | 7/2010 | Tabatabaie | H01L 27/0617 257/213 |
| 2015/0293302 A1* | 10/2015 | Czornomaz | G02B 6/43 385/14 |

FOREIGN PATENT DOCUMENTS

| | | |
|---|---|---|
| JP | 2010027732 | 2/2010 |
| TW | I468562 B | 1/2015 |

OTHER PUBLICATIONS

List of IBM Patents or Patent Applications Treated as Related dated Apr. 9, 2018, 2 pages.

Strittmatter et al., "High-Frequency, Long-Wavelength Resonant-Cavity-Enhanced InGaAs MSM Photodetectors," 22nd European Conference on Optical Communication—ECOC'96, vol. 1, Sep. 1996, pp. 145-148.

Scool et at al., "InGaAs Metal-Semiconductor-Metal Photodetectors for Long Wavelength Optical Communications," IEEE Journal of Quantum Electronics, vol. 21, No. 3, Mar. 1991, pp. 737-752.

Osowski et al, A Strained-Layer InGaAs—GaAs—AlGaAs Single Quantum Well Broad Spectrum LED by Selective-Area Metalorganic Chemical Vapor Deposition, IEEE Photonics Technology Letters, vol. 6, No. 11, Nov. 1994, pp. 1289-1292.

List of IBM Patents or Patent Applications Treated as Related dated Jan. 2, 2020, 2 pages.

\* cited by examiner

US 11,069,833 B2

RESONANT CAVITY STRAINED III-V PHOTODETECTOR AND LED ON SILICON SUBSTRATE

BACKGROUND

Technical Field

The present disclosure relates to photodetectors and light emitting devices (LEDs), and more particularly to extending photodetection in photodetectors to long wavelengths and extending light emission from LEDs to long wavelengths.

Description of the Related Art

Photodetectors are broadly defined as devices which respond to incident electromagnetic radiation by converting the radiation into electrical energy, thereby enabling measurement of the intensity of the incident radiation. A photodetector typically includes some sort of photoconductive device and external measurement circuitry.

Light emitting diodes can be broadly defined as devices which respond to electrical energy with emission of light. For example, a light-emitting diode (LED) is a two-lead semiconductor light source. It is a p-n junction diode, which emits light when activated. When a suitable voltage is applied to the leads, electrons are able to recombine with electron holes within the device, releasing energy in the form of photons. This effect is called electroluminescence, and the color of the light (corresponding to the energy of the photon) is determined by the energy band gap of the semiconductor.

SUMMARY

In one embodiment, the present disclosure provides a photodetector comprising a germanium containing buffer layer atop a silicon containing substrate. A first distributed Bragg reflector stack of III-V semiconductor material is present on the germanium containing buffer layer. An absorption layer of III-V semiconductor material is present on the first distributed Bragg reflector stack of III-V semiconductor material, wherein a difference in lattice dimension between the absorption layer and the first distributed Bragg reflector stack of III-V semiconductor material induces a strain in the absorption layer. A second distributed Bragg reflector stack of III-V semiconductor material is present on the absorption layer. The strain induced on the absorption layer provides that the photodetector detects light wavelengths greater than 800 nm.

In another embodiment, the present disclosure provides a light emitting diode comprising a germanium containing buffer layer atop a silicon containing substrate. A first distributed Bragg reflector stack of III-V semiconductor material is present on the germanium containing buffer layer. A light emission layer of III-V semiconductor material is present on the first distributed Bragg reflector stack of III-V semiconductor material, wherein a difference in lattice dimension between the light emission layer and the first distributed brag reflector stack of III-V semiconductor material induces a strain in the light emission layer. A second distributed Bragg reflector stack of III-V semiconductor material is present on the light emission layer. The strain induced on the emission layer provides that the light emitting diode emits light wavelengths greater than 800 nm.

In another aspect of the present disclosure, a method of forming an optoelectronic device is provided. In some embodiments, the method may begin with forming a buffer layer of a germanium containing layer on a silicon containing substrate. A first distributed Bragg reflector stack of III-V semiconductor material having a first conductivity type is formed on the buffer layer. An active layer is epitaxially formed on the first distributed Bragg reflector stack of III-V semiconductor material, wherein a difference in lattice dimension between the active layer and the first distributed Bragg reflector induces a strain in the active layer. A second distributed Bragg reflector stack of III-V semiconductor material having a second conductivity type is formed on the active layer. The active layer functions as an absorption layer of a photodetector that detects wavelengths greater than 800 nm when a forward bias is applied to the optoelectronic device. The active layer functions as an emission layer of a light emitting diode that emits wavelengths greater than 800 nm when a reverse bias is applied to the optoelectronic device.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
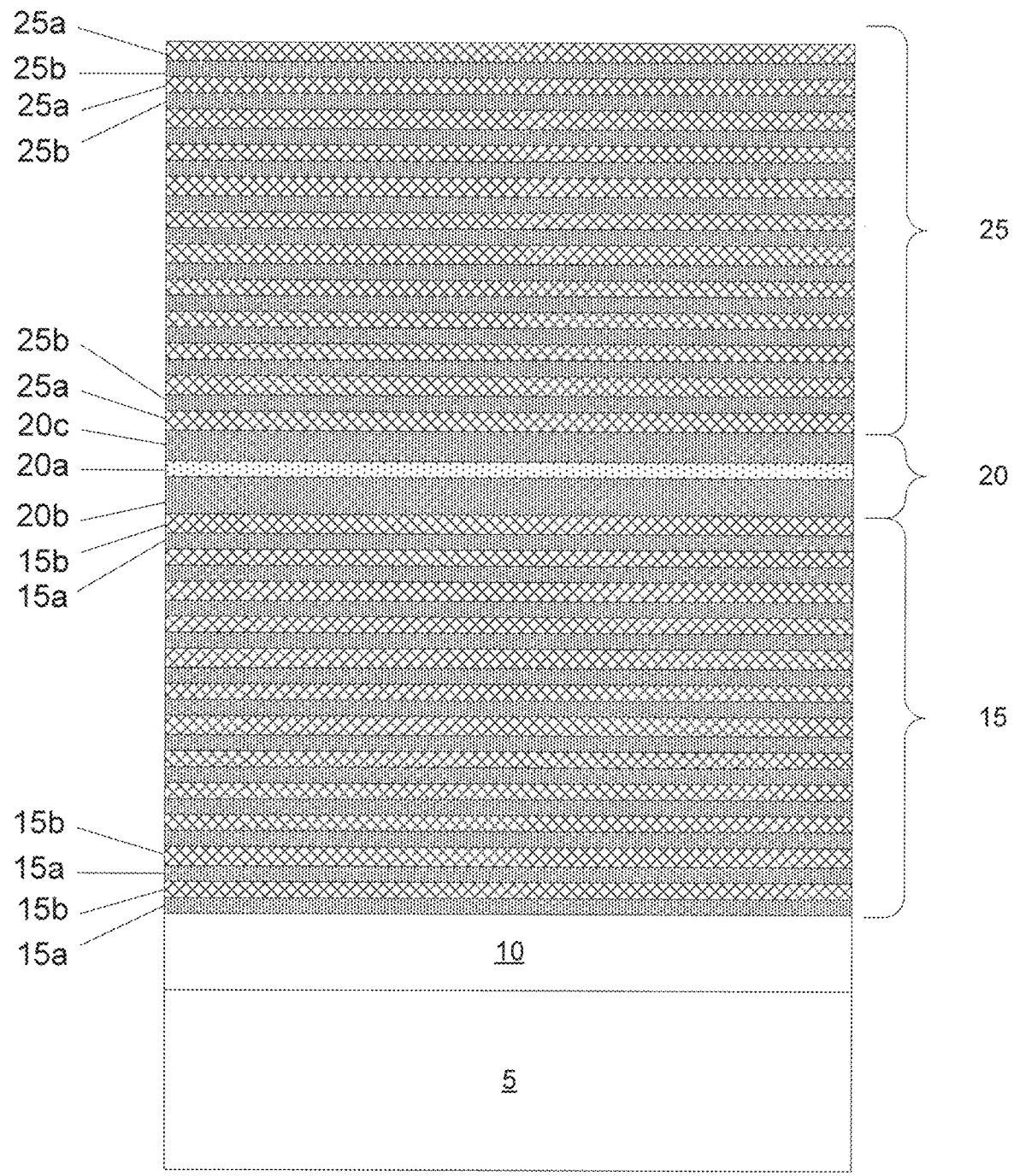
FIG. 1 is a side cross-section view of a resonant cavity optoelectronic device, e.g., a resonant cavity photodetector or a resonant cavity light emitting diode, which includes a strained type III-V active layer positioned between first and second distributed Bragg reflector stack of III-V semiconductor material, in accordance with one embodiment of the present disclosure.

The present principles provide resonant cavity optoelectronic devices, such as photodetectors and light emitting diodes, in which the active material layer of the resonant cavity optoelectronic device is a strained, e.g., tensile strained or compressively strained, type III-V semiconductor material. As used herein, the term "resonant cavity" as used to describe an optoelectronic device, such as a light emitting diode (LED) or photodetector, denotes that the active layer of the optoelectronic device is present inside a Fabry-Perot resonant cavity. This means that the active layer for the optoelectronic device may be present between two mirrored surfaces. In some embodiments, the two mirrored surfaces may each include a Bragg mirror, which is also referred to as distributed Bragg reflector. A distributed Bragg reflector is a mirror structure which consists of an alternating sequence of layers of two different optical materials. One design is that of a quarter-wave mirror, where each optical layer thickness corresponding to one quarter of the wavelength for which the mirror is designed. The latter condition holds for normal incidence; if the mirror is designed for larger angles of incidence, accordingly thicker layers are needed. The principle of operation for the Bragg reflector can be understood as follows. Each interface between the two materials contributes a Fresnel reflection. For the design wavelength, the optical path length difference between reflections from subsequent interfaces is half the wavelength; in addition, the amplitude reflection coefficients for the interfaces have alternating signs. Therefore, all reflected components from the interfaces interfere constructively, which results in a strong reflection. The reflectivity achieved is determined by the number of layer pairs and by the refractive index contrast between the layer materials. The reflection bandwidth is determined mainly by the index contrast.

In some embodiments, the active layers are epitaxially formed on at least one of the material layers that provide one of the distributed Bragg reflectors, in which the material compositions for the distributed Bragg reflector and the active layers result in a difference in lattice dimensions. The difference in lattice dimension induces a strain in the active layer of the optoelectronic device. In some embodiments, using thin layer strained type III-V semiconductor material on a lattice mismatched silicon containing substrate, e.g., silicon substrate, extends the photodetection performance of a photodetector to long wavelengths on the order of 850 nm or greater. In some embodiments, using thin layer strained type III-V semiconductor material on a lattice mismatched silicon containing substrate, e.g., silicon substrate, extends the light emission performance of light emitting diodes (LEDs) to wavelengths on the order or 850 nm or greater. Additionally, the resonant cavity can help to enhance the photodetection and light emission using a thin layer of material, which can be grown substantially free of defects on the silicon containing substrate. Further details regarding the optoelectronic devices, and methods of forming optoelectronic devices are now provided with reference to FIGS. 1-4.

It is to be understood that the concepts of the present disclosure will be described in terms of a given illustrative structure; however, other structures, substrate materials and process features and steps may be varied within the scope of the present disclosure. It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIG. 1 depicts one embodiment of a resonant cavity optoelectronic device 100, e.g., a resonant cavity photodetector or a resonant cavity light emitting diode, which includes a strained type III-V active layer 20 positioned between first and second distributed Bragg reflector stack of III-V semiconductor material layers 15, 25. In one embodiment, the optoelectronic device 100 includes a germanium containing buffer layer 10 atop a silicon containing substrate 5, and a first distributed Bragg reflector stack of III-V semiconductor material layers 15 on the buffer layer. The optoelectronic device 100 may further include an active layer 20 of III-V semiconductor material present on the first distributed Bragg reflector stack 15, wherein a difference in lattice dimension between the active layer 20 and the first distributed Bragg reflector stack 15 induces a strain in the active layer 20. In the embodiments in which the optoelectronic device 100 is a photodetector, the active layer 20 includes an absorbing layer, and in the embodiments in which the optoelectronic device 100 is a light emitting diode (LED), the active layer 20 is an emission layer. A second distributed Bragg reflector stack 25 of III-V semiconductor material layers may be present on the active layer 20.

In one embodiment, the silicon containing substrate 5 may be a bulk-semiconductor substrate. In one example, the bulk-semiconductor substrate may be composed substantially entirely of silicon, e.g., greater than 97 at. % silicon (Si). In some embodiments, the silicon containing substrate 5 is greater than 99 at. % silicon (Si). In other embodiments, the silicon containing substrate 5 is 100 at. % silicon (Si). Other illustrative examples of Si-containing materials suitable for the silicon containing substrate 5 include, but are not limited to, Si, SiGe, SiGeC, SiC, polysilicon, i.e., polySi, epitaxial silicon, i.e., epi-Si, amorphous Si, i.e., α:Si, and multi-layers thereof. Although not depicted in FIG. 1, the silicon containing substrate 5 may also be a semiconductor on insulator (SOI) substrate. In some embodiments, the silicon containing substrate 5 may be light transmissive. The term "light transmissive" or "light transmitting" denotes that the material allows for the transmission of light there through. For example, a light transmissive substrate may allow for visible light, e.g., light having a wavelength of approximately 400 nm to approximately 700 nm, to be transmitted there through. In one example, the light transmissive substrate may have a refractive index that is equal to approximately n=1.5.

The germanium containing buffer layer 10 may be an epitaxially formed semiconductor layer. In some embodiments, the buffer layer provides for gradual change in lattice dimension as a transition from the silicon containing substrate 5 to the overlying distributed Bragg reflector stack of III-V semiconductor material layers 15. The germanium containing buffer layer 10 may have a final germanium (Ge) content ranging from about 0.1 to about 100 at. %. The germanium containing buffer layer 19 may have a thickness of about 2000 nm or less, with a thickness from about 10 to about 100 nm being more highly preferred. The germanium containing buffer layer 19 is substantially free of defects. When the optimal conditions are employed, the germanium containing buffer layer 19 has a defect density that is less than about 1000 defects/cm$^2$.

In one example, the germanium containing buffer layer 19 and the substrate 5 may be provided by a germanium on insulator (GOI) substrate.

The first distributed Bragg reflector stack 15 of type III-V semiconductor material may be epitaxially formed on the germanium containing buffer layer. The term "type III-V semiconductor" denotes a semiconductor material that includes at least one element from Group IIIA of the Periodic Table of Elements and at least one element from Group VA of the Periodic Table of Elements. Typically, the III-V compound semiconductors are binary, ternary or quaternary alloys including III/V elements. Examples of III-V semiconductor materials suitable for use with the present disclosure, e.g., use in the first and second distributed Bragg reflector stack 15, 25 and the active layer 20, include (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The first distributed Bragg reflector stack 15 of type III-V semiconductor material may be lattice matched to the germanium containing buffer layer 10. In some embodiments, the first distributed Bragg reflector stack 15 includes an alternating sequence of two type III-V semiconductor material compositions. For example, the first type III-V semiconductor material layer 15a of the first distributed Bragg reflector stack 15 that is in direct contact with the germanium containing buffer layer 10 may be composed of $Al_{0.2}Ga_{0.8}As$, and the second type III-V semiconductor material layer 15b of the first distributed Bragg reflector stack 15 may be composed of $Al_{0.1}Ga_{0.9}As$, in which the first and second type III-V semiconductor material layers 15a, 15b are present in an alternating sequence through the first distributed Bragg reflector stack 15. In one embodiment, the first distributed Bragg reflector stack 15 may be composed of 10 to 30 layers of alternating composition type III-V semiconductor layers. In another embodiment, the first distributed Bragg reflector stack 15 may be composed of 15 to 25 layers of alternating composition type III-V semiconductor layers. Each of the type III-V semiconductor material layers in the first distributed Bragg reflector stack 15 may have a thickness ranging from 5 nm to 30 nm. In another embodiment, each of the type III-V semiconductor material layers in the first distributed Bragg reflector stack 15 may have a thickness ranging from 10 nm to 25 nm.

The term "conductivity type" denotes that a semiconductor material has been doped to provide an p-type or n-type conductivity. In some embodiments, the first distributed Bragg reflector stack 15 has been doped to an n-type conductivity and the second distributed Bragg reflector stack 25 has been doped to a p-type conductivity. For type III-V semiconductor materials, an n-type dopant may be provided by an element from Group IVA or VIA of the Periodic Table of Elements, and a p-type dopant may be provided by an element from Group IIA or VIA of the Periodic Table of Elements.

Similar to the germanium containing buffer layer 20, the first distributed Bragg reflector stack 15 may be substantially free of defects. For example, when the optimal conditions are employed, the first distributed Bragg reflector stack 15 has a defect density that is less than about 1000 defects/cm$^2$.

Still referring to FIG. 1, the active layer 20 of type III-V semiconductor material may be epitaxially formed on the first distributed Bragg reflector stack 15. In the embodiments in which the optoelectronic device 100 is forward biased, the optoelectronic device 100 functions as a light emitting diode, wherein at least a portion, e.g., intrinsic active layer 20a, of the active layer 20 is an emission layer. In the embodiments, in which the optoelectronic device 100 is reverse biased, the optoelectronic device 100 functions as a photodetector, wherein at least a portion, e.g., intrinsic active layer 20a, of the active layer 20 is an absorbing layer.

The active layer 20 is epitaxially formed having a composition that provides a different lattice dimension than the upper surface of the first distributed Bragg reflector stack 15. The difference in lattice dimension between the active layer 20 and the first distributed Bragg reflector stack 15 induces a strain within the active layer 20. For example, the strain induced in the active layer 20 may be a compressive strain ranging from 0.5% to 5%. The strain induced within the active layer 20 increases the wavelengths that are sensed/emitted by the optoelectronic device 100. In one embodiment, when the optoelectronic device 100 is a photodetector, the wavelength of light that can be detected may be greater than 850 nm. In some examples, the wavelength of light that can be detected by the resonant cavity strained III-V photodetector may be equal to 1.5 microns, 1.55 microns, 1.6 microns, 1.65 microns, and 1.7 microns. The wavelength of light that can be detected by the resonant cavity strained III-V photodetector may also be any value within a range defined by a lower limit and upper limit selected from the aforementioned examples.

In another embodiment, when the optoelectronic device 100 is a light emitting diode (LED), the wavelength of light that can be emitted may be greater than 850 nm. In some examples, the wavelength of light that can be emitted by the resonant cavity strained III-V LED may be equal to 1.5 microns, 1.55 microns, 1.6 microns, 1.65 microns, and 1.7 microns. The wavelength of light that can be emitted by the resonant cavity strained III-V LED may also be any value within a range defined by a lower limit and upper limit selected from the aforementioned examples.

In one example to provide the difference in lattice dimension for inducing a strain in the active layer 20, the active layer 20 may be composed of $In_{0.53}Ga_{0.47}As$, and the surface of the first distributed Bragg reflector stack 15 that the active layer 20 is formed on may be composed of one of $Al_{0.2}Ga_{0.8}As$, and $Al_{0.1}Ga_{0.9}As$. The active layer 20 may have a thickness ranging from 5 nm to 30 nm. In another embodiment, the active layer 20 may have a thickness ranging from 10 nm to 25 nm.

In some embodiments, the active layer 20 may be substantially defect free. For example, when the optimal conditions are employed, the active layer 20 can have a defect density that is less than about 1000 defects/cm$^2$.

In some embodiments, the active layer 20 is an intrinsic type III-V semiconductor material. In some embodiments, the intrinsic type III-V semiconductor material 20a is centrally positioned in the active layer 20; a first conductivity doped portion 20b, e.g., n-type doped portion, of the active layer 20 is positioned proximate to the interface between the active layer 20 and the first distributed Bragg reflector stack 15; and a second conductivity doped portion 20c, e.g., p-type doped portion, of the active layer 20 is positioned proximate to the interface between the active layer 20 and the second distributed Bragg reflector stack 25.

Similar to the first distributed Bragg reflector stack 15, the second distributed Bragg reflector stack 25 may be composed of type III-V semiconductor material that can be substantially lattice matched to the germanium containing buffer layer 10. In some embodiments, the second distributed Bragg reflector stack 25 includes an alternating sequence of two type III-V semiconductor material compositions. For example, the first type III-V semiconductor material layer 25a of the second distributed Bragg reflector stack 25 that is in direct contact with active layer 20 may be composed of $Al_{0.2}Ga_{0.8}As$, and the second type III-V semiconductor material layer 25b of the second distributed Bragg reflector stack 25 may be composed of $Al_{0.1}Ga_{0.9}As$, in which the first and second type III-V semiconductor material layers 25a, 25b are present in an alternating sequence through the first distributed Bragg reflector stack 25. In one embodiment, the second distributed Bragg reflector stack 25 may be composed of 10 to 30 layers of alternating composition type III-V semiconductor layers. In another embodiment, the second distributed Bragg reflector stack 25 may be composed of 15 to 25 layers of alternating composition type III-V semiconductor layers. Each of the type III-V semiconductor material layers in the second distributed Bragg reflector stack 25 may have a thickness ranging from 5 nm to 30 nm. In another embodiment, each of the type III-V semiconductor material layers in the second distributed Bragg reflector stack 25 may have a thickness ranging from 10 nm to 25 nm.

Although not depicted in FIG. 1, the optoelectronic device 100 may further includes electrodes, such as cathode and anodes that can be positioned at substantially opposing ends of the device. The electrodes may be composed of indium tin oxide or a metal.

Figure 2:
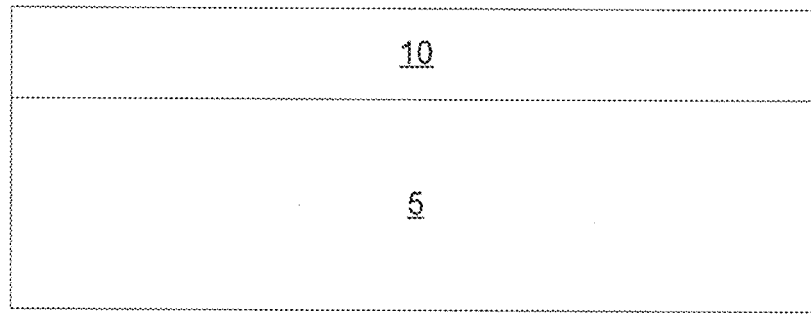
FIG. 2 is a side cross-sectional view depicting depositing a germanium containing buffer layer on a silicon containing substrate, in accordance with one embodiment of the present disclosure.

In another aspect of the present disclosure, a method of forming an optoelectronic device 100 is provided. In some embodiments, the method may begin with forming a buffer layer of a germanium containing layer 10 on a silicon containing substrate 5, as depicted in FIG. 2. The buffer layer of the germanium containing layer 10 may be formed using an epitaxial deposition process. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

A number of different sources may be used for the epitaxial deposition of the semiconductor material that forms the buffer layer of the germanium containing layer 10. For example, germanium containing precursors for epitaxial deposition may include germanium gas selected from the group consisting of germane ($GeH_4$), digermane ($Ge_2H_6$), halogermane, dichlorogermane, trichlorogermane, tetrachlorogermane and combinations thereof.

It is noted that deposition is only one method that is applicable for forming the germanium containing layer 10. The germanium containing buffer layer 10 may be transferred to the silicon containing substrate 5 using layer transfer and bonding methods. Additionally, the germanium containing layer 10 and the silicon containing substrate may be provided by a preformed germanium on insulator (GOI) substrate. In this example, a dielectric layer may be present between the germanium containing buffer layer 10 and the silicon containing substrate 5.

Figure 3:
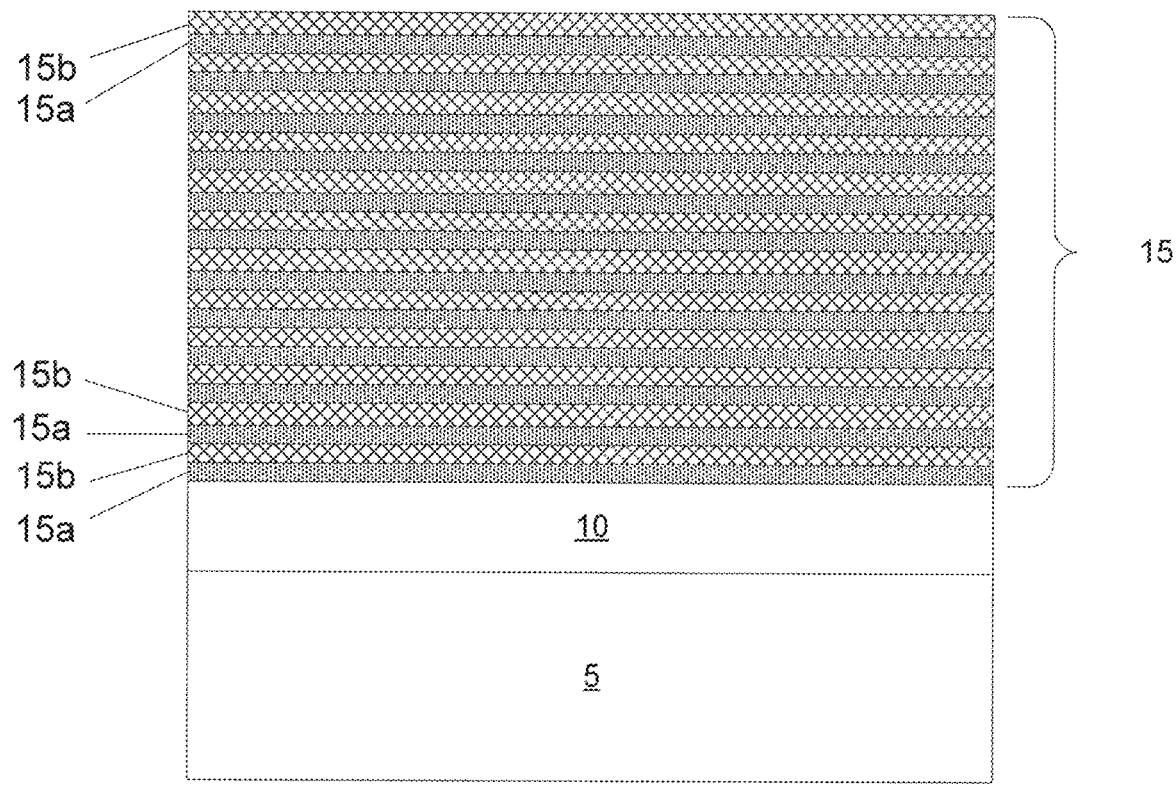
FIG. 3 is a side cross-sectional view depicting forming a first distributed Bragg reflector stack of III-V semiconductor material on the germanium containing buffer layer, in accordance with one embodiment of the present disclosure.

FIG. 3 depicted one embodiment of forming a first distributed Bragg reflector stack 15 of III-V semiconductor material layers on the germanium containing buffer layer 10. Similar to the germanium containing buffer layer 10, the first distributed Bragg reflector stack 15 may be formed using epitaxial deposition. A number of different sources may be used for the deposition of epitaxial type III-V semiconductor material. In some embodiments, the sources for epitaxial growth of type III-V semiconductor material include solid sources containing In, Ga, and As elements and combinations thereof. The precursor gasses are selected and sequenced to provide a lattice dimension for the first type III-V semiconductor material layer 15a and the second type III-V semiconductor material layer 15b of the first distributed Bragg reflector stack 15 that is substantially equal to the lattice dimension of the germanium containing buffer layer 10. In one embodiment, the gas precursors for epitaxially forming the first type III-V semiconductor material layer 15a are selected to provide $Al_{0.2}Ga_{0.8}As$, and the gas precursors for epitaxially forming the second type III-V semiconductor material layer 15b are selected to provide $Al_{0.1}Ga_{0.9}As$.

Figure 4:
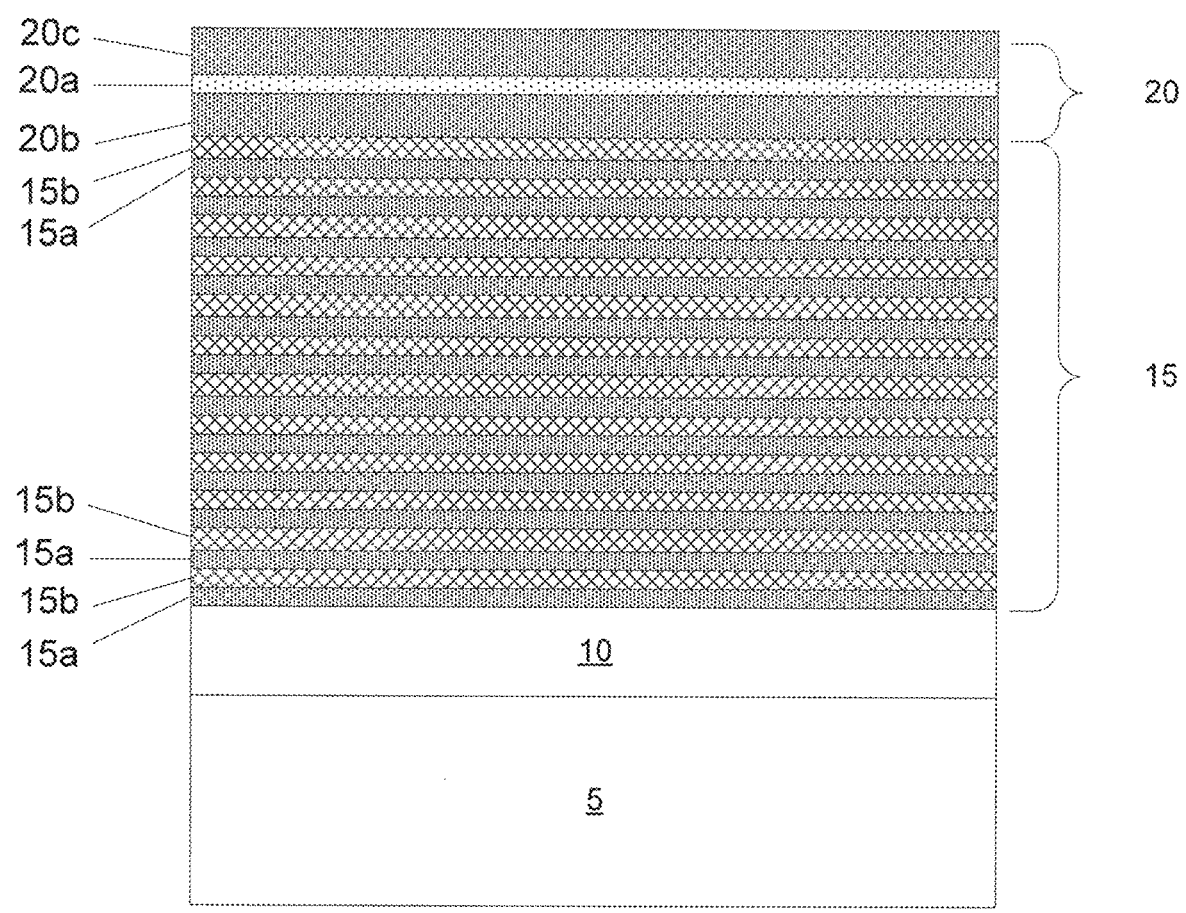
FIG. 4 is a side cross-sectional view depicting epitaxially depositing an active layer of a III-V semiconductor material on the first distributed Bragg reflector stack of III-V semiconductor material, wherein a difference in lattice dimension between the active layer and the first distributed Bragg reflector stack induces a strain in the active layer.

In some embodiments, at least a portion of the first distributed Bragg reflector stack 15 is doped to an n-type conductivity. The n-type dopant may be introduced to the first distributed Bragg reflector stack 15 in-situ. By "in-situ" it is meant that the dopant that dictates the conductivity type of the III-V semiconductor material layers of the first distributed Bragg reflector stack 15 is introduced during the process step, e.g., epitaxial deposition, that forms the III-V semiconductor material layers of the first distributed Bragg reflector stack 15. In other embodiments, the first distributed Bragg reflector stack 15 may be doped using ion implantation or gas phase doping. FIG. 4 depicts one embodiment of epitaxially depositing an active layer 20 on the first distributed Bragg reflector stack 15 of III-V semiconductor material. The epitaxial deposition process for forming the active layer 20 is similar to the epitaxial deposition process described above for forming the first distributed Bragg reflector stack 15 with the exception that the composition of the III-V semiconductor material for the active layer provides a different lattice dimension than the lattice dimension of the III-V semiconductor material of the first distributed Bragg reflector stack 15. The lattice dimension of the material of the first distributed Bragg reflector stack 15 is substantially equal to the lattice dimension of the germanium containing buffer layer 10. In one embodiment, the epitaxial deposition process forms an active layer that is composed of $In_{0.53}Ga_{0.47}As$. The different in lattice dimension between the active layer 20 and the first distributed Bragg reflector 15 induces a strain in the active layer 20.

The active layer 20 typically includes an intrinsic portion. This portion of the active layer 20 is not doped with a p-type or n-type dopant. In-situ doping may be employed to provide an n-type dopant region at the interface of the active layer 20 and the first distributed Bragg reflector stack 15. In-situ doping may also be employed to provide a p-type dopant region at the interface of the active layer 20 and the second distributed Bragg reflector stack 25.

Referring to FIG. 1, a second distributed Bragg reflector stack 25 of III-V semiconductor material may then be formed on the active layer 20. The second distributed reflector stack 25 is formed using similar epitaxial deposition methods to the deposition methods used to form the first distributed Bragg reflector stack 15. Epitaxial deposition may be used to provide a first type III-V semiconductor material layer 25a of the second distributed Bragg reflector stack 25 that is in direct contact with active layer 20 that is composed of $Al_{0.2}Ga_{0.8}As$, and the second type III-V semiconductor material layer 25b of the second distributed Bragg reflector stack 25 that is composed of $Al_{0.1}Ga_{0.9}As$. The second distributed Bragg reflector stack 25 may be in situ doped to a p-type conductivity.

The active layer functions as an absorption layer of a photodetector that detects wavelengths greater than 800 nm when a forward bias is applied to the optoelectronic device. The active layer functions as an emission layer of a light emitting diode that emits wavelengths greater than 800 nm when a reverse bias is applied to the optoelectronic device.

Having described preferred embodiments of a device and method for uniformly distributed self-assembled solder dot formation for high efficiency solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of an optoelectronic device comprising:
   forming a buffer layer on a type IV semiconductor containing substrate, the buffer layer having a detect density that is less than about 1000 defects/$cm^2$;
   forming a first reflector stack of III-V semiconductor material on the buffer layer, wherein the first reflector stack is comprised of at least one aluminum, gallium and arsenic containing layer;
   forming an active layer on the first reflector stack, wherein a difference in lattice dimension between the active layer and the first reflector stack induces a strain in the active layer, wherein the active layer functions as an emission layer; and
   forming a second reflector stack of III-V semiconductor material on the active layer, wherein the optoelectronic device emits light wavelengths greater than 800 nm.

2. The method of claim 1, wherein the buffer layer contains germanium.

3. The method of claim 1, wherein the active layer has a thickness no greater than 30 nm.

4. The method of claim 1, wherein the active layer has a defect density less than 1,000 defects/$cm^2$.

5. The method of claim 1, wherein the first reflector stack is in situ doped to a first conductivity type, and the second reflector stack is in situ doped to a second conductivity type.

6. The method of claim 1, wherein the active layer is intrinsic.

7. The method of claim 6, wherein an in situ doped first conductivity type doped region is present between the active layer and the first reflector stack.

8. The method of claim 7, wherein an in situ doped second conductivity type doped region is present between the active layer and the second reflector stack.

9. The method of claim 1, wherein a lattice dimension for the III-V semiconductor material in the first reflector stack and the second reflector stack is substantially equal to a lattice dimension of the buffer layer.

10. The method of claim 1, wherein the first reflector stack is comprised of $Al_{0.2}Ga_{0.8}As$.

11. The method of claim 1, wherein the second reflector stack is comprised of $Al_{0.2}Ga_{0.8}As$.

12. The method of claim 1, wherein the first reflector stack is comprised of $Al_{0.1}Ga_{0.9}As$.

13. The method of claim 1, wherein the second reflector stack is comprised of $Al_{0.1}Ga_{0.9}As$.

14. A method of an optoelectronic device comprising:
    forming a first reflector stack of III-IV semiconductor material on a germanium containing buffer layer, the germanium containing buffer layer having a defect density that is less than about 1000 defects/$cm^2$;
    forming an active layer on the first reflector stack, the active layer is comprised of an indium, gallium and arsenic containing composition, wherein a difference in lattice dimension between the active layer and the first reflector stack induces a strain in the active layer; and
    forming a second reflector stack of III-V semiconductor material on the active layer, wherein the second reflector stack is comprised of an aluminum, gallium and arsenic containing layer, wherein the optoelectronic device emits light wavelengths greater than 800 nm.

15. The method of claim 14, wherein the active layer has a defect density less than 1,000 $cm^2$.

16. The method of claim 14, wherein the first reflector stack is in situ doped to a first conductivity type, and the second reflector stack is in situ doped to a second conductivity type.

17. The method of claim 14, wherein the active layer is intrinsic.

18. The method of claim 14, wherein a lattice dimension for the III-V semiconductor material in the first reflector stack and a second reflector stack is substantially equal to a lattice dimension of the germanium containing buffer layer.

19. The method of claim 14, wherein at least one of the first and second reflectors is comprised of $Al_{0.2}Ga_{0.8}As$.

* * * * *